United States Patent
Ragunathan et al.

(10) Patent No.: US 10,283,381 B2
(45) Date of Patent: May 7, 2019

(54) APPARATUS FOR PLASMA DICING

(71) Applicant: SPTS Technologies Limited, Newport (GB)

(72) Inventors: Gautham Ragunathan, West Midlands (GB); David Tossell, Bristol (GB); Oliver Ansell, Newport (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 63 days.

(21) Appl. No.: 15/293,153

(22) Filed: Oct. 13, 2016

(65) Prior Publication Data
US 2017/0117166 A1  Apr. 27, 2017

(30) Foreign Application Priority Data
Oct. 22, 2015  (GB) ...................... 1518756

(51) Int. Cl.
*H01J 37/32* (2006.01)
*H01L 21/3065* (2006.01)
(Continued)

(52) U.S. Cl.
CPC .. *H01L 21/67069* (2013.01); *H01J 37/32623* (2013.01); *H01J 37/32715* (2013.01); *H01L 21/3065* (2013.01); *H01L 21/6831* (2013.01); *H01L 21/6836* (2013.01); *H01L 21/68721* (2013.01); *H01L 21/68778* (2013.01); *H01L 21/68785* (2013.01); *H01L 21/78* (2013.01); *H01L 21/67092* (2013.01); *H01L 2221/68327* (2013.01)

(58) Field of Classification Search
None
See application file for complete search history.

(56) References Cited

U.S. PATENT DOCUMENTS

| | | |
|---|---|---|
| 7,060,531 B2 | 6/2006 | Arita |
| 7,781,310 B2 | 8/2010 | Grivna |

(Continued)

FOREIGN PATENT DOCUMENTS

| | | |
|---|---|---|
| JP | 2002-141337 A | 5/2002 |
| JP | 2005252126 A | 9/2005 |

(Continued)

OTHER PUBLICATIONS

Extended Eurpean Search Report dated Mar. 15, 2017 in Related European Application No. 16194163.8-1555.

*Primary Examiner* — Erik T. K. Peterson
(74) *Attorney, Agent, or Firm* — Volentine, Whitt & Francos, PLLC

(57) ABSTRACT

An apparatus is for plasma dicing a semiconductor substrate of the type forming part of a workpiece, the workpiece further including a carrier sheet on a frame member, where the carrier sheet carries the semiconductor substrate. The apparatus includes a chamber, a plasma production device configured to produce a plasma within the chamber suitable for dicing the semiconductor substrate, a workpiece support located in the chamber for supporting the workpiece through contact with the carrier sheet, and a frame cover element configured to, in use, contact the frame member thereby clamping the carrier sheet against an auxiliary element disposed in the chamber.

15 Claims, 4 Drawing Sheets

(51) Int. Cl.
*H01L 21/67* (2006.01)
*H01L 21/683* (2006.01)
*H01L 21/687* (2006.01)
*H01L 21/78* (2006.01)

(56) References Cited

U.S. PATENT DOCUMENTS

| | | | |
|---|---|---|---|
| 7,994,026 B2 | 8/2011 | Harikai et al. | |
| 8,691,702 B2 | 4/2014 | Geerpuram et al. | |
| 8,778,806 B2* | 7/2014 | Johnson | H01L 21/3065 |
| | | | 438/113 |
| 8,802,545 B2 | 8/2014 | Johnson et al. | |
| 8,941,968 B2 | 1/2015 | Justesen et al. | |
| 9,034,771 B1 | 5/2015 | Nangoy | |
| 9,117,868 B1 | 8/2015 | Nangoy | |
| 9,478,455 B1* | 10/2016 | Ouye | H01L 21/3065 |
| 2005/0016684 A1* | 1/2005 | Sun | H01J 37/32477 |
| | | | 156/345.51 |
| 2005/0061447 A1* | 3/2005 | Kim | H01J 37/32623 |
| | | | 156/345.51 |
| 2007/0065597 A1* | 3/2007 | Kaido | C23C 16/042 |
| | | | 427/569 |
| 2010/0048001 A1* | 2/2010 | Harikai | H01J 37/32743 |
| | | | 438/464 |
| 2010/0173474 A1* | 7/2010 | Arita | H01L 21/78 |
| | | | 438/462 |
| 2010/0216313 A1 | 8/2010 | Iwai | |
| 2012/0216313 A1 | 8/2012 | Den Braber | |
| 2013/0230971 A1 | 9/2013 | Geerpuram et al. | |
| 2013/0230973 A1* | 9/2013 | Gauldin | H01L 21/68771 |
| | | | 438/464 |
| 2014/0202631 A1* | 7/2014 | Kanbara | H01J 37/32642 |
| | | | 156/285 |
| 2014/0213041 A1 | 7/2014 | Lei et al. | |
| 2014/0283743 A1* | 9/2014 | Yasumatsu | C23C 14/3407 |
| | | | 118/504 |
| 2014/0335696 A1* | 11/2014 | Nishizaki | H01L 21/3065 |
| | | | 438/710 |
| 2015/0059980 A1* | 3/2015 | Okita | H01J 37/32477 |
| | | | 156/345.51 |
| 2015/0122776 A1* | 5/2015 | Okita | H01L 21/6831 |
| | | | 216/67 |
| 2015/0126038 A1 | 5/2015 | Okita | |
| 2015/0221553 A1* | 8/2015 | Ouye | H01L 21/683 |
| | | | 438/462 |
| 2016/0064196 A1* | 3/2016 | Okita | H01L 21/78 |
| | | | 216/58 |
| 2016/0064198 A1* | 3/2016 | Okita | H01J 37/32724 |
| | | | 216/45 |
| 2016/0240352 A1* | 8/2016 | Iwai | H01J 37/3244 |

FOREIGN PATENT DOCUMENTS

| | | |
|---|---|---|
| JP | 2007-294812 A | 11/2007 |
| JP | 2009-094436 A | 4/2009 |
| JP | 2012-248741 A | 12/2012 |
| JP | 2014-063810 A | 4/2014 |
| JP | 2016-051876 A | 4/2016 |
| WO | WO0019481 A2 | 4/2000 |
| WO | WO2014/158886 A1 | 10/2014 |

\* cited by examiner

APPARATUS FOR PLASMA DICING

BACKGROUND

This invention relates to apparatus for plasma dicing a semiconductor substrate of the type forming part of a workpiece, the workpiece further comprising a carrier sheet on a frame member, wherein the carrier sheet carries the semiconductor substrate. The invention relates also to associated methods of plasma dicing.

Semiconductor manufacture typically involves large numbers of silicon chips being processed in parallel on a single semiconductor wafer. Once the processing steps are completed, the wafer must be diced into discrete chips. Connections are then made to the chips which are subsequently packaged. Traditionally, the dicing step has been carried out using diamond saws which cut along scribe lines on the wafer. Recently, there has been much interest in providing new methods for dicing wafers. These offer the possibility of enhanced performance and lower cost. One such approach is to use lasers to carry out the dicing of the wafer. An alternative approach is to use plasma etching to dice the wafer. This has benefits in terms of minimising die edge damage, maximising the efficient use of the wafer surface by using very narrow scribe lines, and providing the option to use non-orthogonal scribe line layouts. Depending on the application requirement, the plasma etching can occur before or after thinning or grinding of the wafer.

Silicon wafers are presented for dicing on a "frame and tape" carrier. FIG. 7 is a semi-schematic representation of such an arrangement showing a silicon wafer 71 with discrete chips 73 separated by scribe lines 72. The wafer 71 is adhered by an adhesive to a carrier tape 74 which is retained by an annular frame ring 76. A plasma 9 is used to etch the exposed scribe lines in a vacuum system (not shown). The wafer 71/carrier tape 74/frame 76 forms a workpiece assembly which is placed on a platen 75. The platen retains the workpiece, provides cooling, and optionally an RF bias to aid the etch process. Frequently, an electrostatic chuck (ESC) is used to improve heat coupling between the wafer and the platen. U.S. Pat. No. 8,691,702 discloses an ESC based platen assembly which can process taped wafers on a frame. A lift mechanism is provided which raises the workpiece to allow it to be moved to and from the platen. A frame cover spaced apart from the frame is provided which protects the lift mechanism and the frame. An extension of the frame cover or a separate component is provided to protect the tape in the vicinity of the frame. The ESC is provided with appropriate cooling channels to remove heat from the chuck. The removal of heat during the process in order to maintain suitable working temperatures is an important consideration. The carrier tape is at particular risk of overheating. Typically, the carrier tape is formed from a polymeric material such as a polyolefin (PO) polyvinyl chloride (PVC) or polyethylene terephthalate (PET) with a softening point of around 90° C. In practice, it is considered necessary to maintain the temperature of the carrier tape at 80° C. or less during processing to avoid damage to the tape or to the acrylic adhesive used on the tape. Thermal runaway is a constant risk as the thickness of the tape is typically less than 200 microns and therefore the tape has a low thermal capacity.

It is desirable for economic reasons to dice wafers as quickly as possible while maintaining the process specification. This is typically achieved by running the plasma etch tool at a high RF power to increase the exposed material in the scribe lines of the semiconductor wafer. The use of high etch rate regimes increases the likelihood of overheating. Therefore, there is a strong desire to achieve high etch rates in plasma dicing to maximise throughput whilst avoiding damage to the workpiece, in particular avoiding damage to the carrier tape or the associated adhesive. It is particularly desirable to be able to maintain the temperature of the carrier tape at 80° C. or less.

SUMMARY

The present invention, in at least some of its embodiments, addresses the above described problems and wants.

According to the first aspect of the invention there is provided an apparatus for plasma dicing a semiconductor substrate of the type forming part of a workpiece, the workpiece further comprising a carrier sheet on a frame member, wherein the carrier sheet carries the semiconductor substrate, the apparatus comprising:

a chamber;

a plasma production device configured to produce a plasma within the chamber suitable for dicing the semiconductor substrate;

a workpiece support located in the chamber for supporting the workpiece through contact with the carrier sheet;

a frame cover element configured to, in use, contact the frame member thereby clamping the carrier sheet against an auxiliary element disposed in the chamber.

The auxiliary element may be the workpiece support.

The auxiliary element may be a shield ring which is disposed around the workpiece support. The shield ring may be in thermal contact with the chamber. Typically, the shield ring may be in thermal contact with one or more interior walls of the chamber.

The apparatus may further comprise a heat shield disposed over the frame cover element to thermally shield the frame cover element from the plasma.

The heat shield may be spaced apart from the frame cover element. The heat shield may be supported on the auxiliary element.

The heat shield may be in contact with the frame cover element. Typically, in these embodiments, it is desirable to minimise the thermal contact between the heat shield and the frame cover element. The heat shield may comprise one or more protrusions which contact the frame cover element. In this way, thermal contact can be reduced. The protrusions may be of any suitable form, such as pins, one or more ridges, or pips.

The heat shield may be formed from a ceramic material. The ceramic material may be alumina.

In the other main embodiments, there is no heat shield present to thermally shield the frame cover element from the plasma.

The apparatus may further comprise at least one clamp which applies a clamping force to the frame cover element to assist the clamping of the carrier sheet against the auxiliary element by the frame cover element. The at least one clamp may directly clamp the frame cover element, or if the heat shield is present, the at least one clamp may clamp the heat shield against the frame cover element to assist the clamping of the carrier sheet against the auxiliary element. The at least one clamp may be mounted on the workpiece support.

The frame cover element may comprise a substantially flat lower surface which, in use, contacts the frame member.

The frame cover element may comprise one or more protrusions which, in use, contacts the frame member. The protrusions may be of any suitable form, such as pins, one or more ridges, or pips. The auxiliary element may comprise one or more openings for receiving the protrusions of the frame cover element when a workpiece is not present on the workpiece support.

The apparatus may be configured so that the frame cover element can be brought into thermal contact with the auxiliary element when a workpiece is not present on the workpiece support.

The frame cover element may be formed from a metal or a ceramic material. An example of a suitable metal is aluminium. An example of a suitable ceramic material is alumina.

The workpiece support may be an electrostatic chuck (ESC). The ESC may be a monopolar or a bipolar ESC.

The apparatus may further comprise a lifting mechanism for lowering and raising the frame into and out of contact with the workpiece support and lowering and raising the frame cover element into out of contact with the frame member and, optionally, the workpiece support.

The apparatus may be provided in combination with a workpiece comprising the semiconductor substrate and a carrier sheet on a frame member, wherein the carrier sheet supports the semiconductor substrate, the workpiece support supports the workpiece through contact with the carrier sheet, and the frame member is clamped by the frame cover element.

The workpiece support may comprise a workpiece support surface which supports the workpiece through contact with the carrier sheet. The workpiece support surface has a periphery. The frame member may define a periphery of the workpiece. The periphery of the workpiece may be wholly located within the periphery of the workpiece support surface.

The carrier sheet may comprise tape formed from a polymeric material, optionally with an adhesive. The polymeric material may be a PO, PVC or PET.

According to a second aspect of the invention there is provided a method of plasma dicing a semiconductor substrate of the type forming part of a workpiece, the workpiece further comprising a carrier sheet on a frame member, wherein the carrier sheet carries the semiconductor substrate, the method comprising the steps of:

providing an apparatus according to the first aspect of the invention;

supporting the workpiece by placing the carrier sheet in contact with the workpiece support;

clamping the carrier sheet against the auxiliary element by contacting the frame member with the frame cover element; and plasma dicing the semiconductor substrate.

The workpiece support may comprise a workpiece support surface which supports the workpiece through contact with the carrier sheet. The workpiece support surface has a periphery. The frame member may define a periphery of the workpiece. The periphery of the workpiece may be wholly located within the periphery of the workpiece support surface.

The workpiece support may be an electrostatic chuck and the portion of the electrostatic chuck which contacts the carrier film may be a substantially flat and featureless upper surface.

The workpiece support may be an electrostatic chuck which acts as the auxiliary element, wherein the electrostatic chuck provides an additional, electrostatic clamping force acting on the frame member.

After the step of plasma dicing the semiconductor substrate is completed, the workpiece may be removed from the chamber and the frame cover element may be brought into thermal contact with the workpiece support.

Whilst the invention has been described above, it extends to any inventive combination of the features set out above, or in the following description, drawings or claims. For example, any feature described in relation to the first aspect of the invention is considered to be disclosed also in relation to the second aspect of the invention.

BRIEF DESCRIPTION OF THE DRAWINGS

Embodiments of apparatus and methods in accordance with the invention will now be described with reference to the accompanying drawings, in which.

DETAILED DESCRIPTION OF EMBODIMENTS

Figure 1:
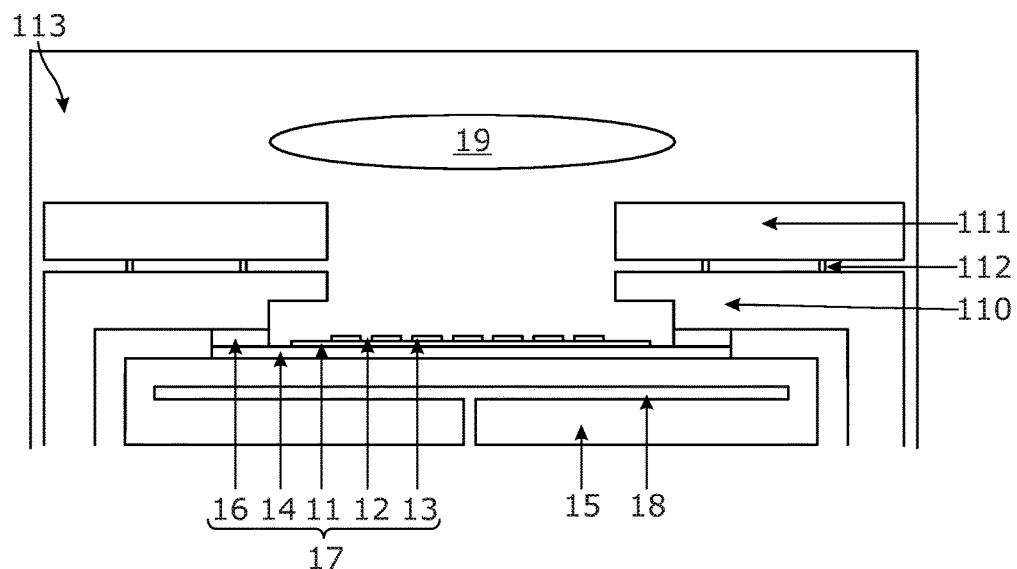
FIG. 1 is a cross sectional view of semiconductor substrate mounted in vacuum processing chamber with additional heat shield.

A first embodiment of the invention is shown in FIG. 1. A semiconductor substrate 11 comprises scribe lines 12 and discrete semiconductor chips 13. The semiconductor substrate 11 is typically composed of silicon, however, gallium arsenide and other III-V semiconductors may be used. The semiconductor substrate 11 is adhered to the dicing tape 14, which is positioned on top of an electrostatic chuck 15. An annular frame 16 is positioned on top of the dicing tape 14 such that the dicing tape 14 is fixed between the annular frame 16 and the electrostatic chuck 15. The semiconductor substrate 11 is designed to accommodate a degree of non-concentricity, typically ±3 mm, in the positioning of the annular frame 16. The frame assembly 17 comprises the semiconductor substrate 11, the dicing tape 14, and the annular frame 16. The dicing tape 14 is typically composed of polyolefin, poly(vinyl chloride), or poly(ethylene terephthalate). The annular frame 16 is typically composed of stainless steel or plastic. The surface area of the frame assembly 17 and the electrostatic chuck 15 are selected so that the electrostatic chuck 15 extends beyond the diameter of the annular frame 16 and contains internal cooling channels 18 where a coolant gas is passed. A high voltage may be applied to the electrostatic chuck 15 to provide a first clamping force to the frame assembly 17. The electrostatic clamping mechanism enables a good thermal contact to exist between the frame assembly 17 and the electrostatic chuck 15. Furthermore, the electrostatic chuck 15 does not contain any surface features within the diameter of the annular frame 16 in order to maximise the thermal contact between the frame assembly 17 and the electrostatic chuck 15. A good thermal contact between the frame assembly 17 and the electrostatic chuck 15 helps to keep the frame assembly 17 cool during plasma treatment and prevent thermal degradation of the dicing tape 14. The annular frame 16 is shielded from direct exposure to the plasma 19 by use of a frame cover 110.

Figure 2:
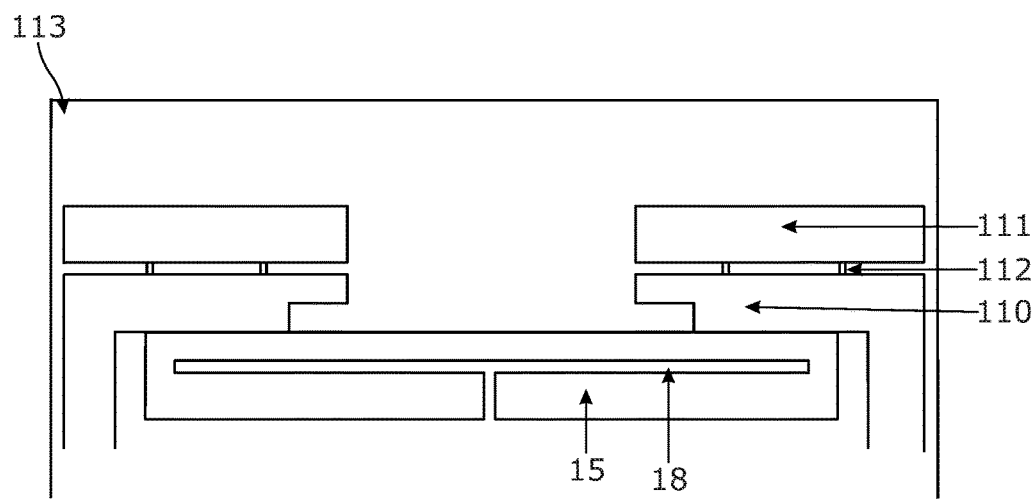
FIG. 2 is a cross sectional view of vacuum processing chamber (from FIG. 1) during a cooling stage, which occurs in between successive plasma treatments.

In one embodiment of the invention the frame cover 110 makes a good thermal contact with the annular frame 16. The frame cover 110 may be provided additional protection from the plasma 19 by the use of a heat shield 111. If a heat shield 111 is employed, the frame cover 110 is composed of a material with a high thermal conductivity, such as aluminium. However, if a heat shield 111 is not used, the frame cover 110 will be in direct contact with the plasma 19 and a material with a low thermal conductivity, such as alumina or other ceramic material, is preferred. The heat shield 111 is typically composed of a material with poor thermal conductivity, such as alumina or other ceramic material. The contact 112 between the heat shield 111 and the frame cover 110 is minimal or non-existent to minimise the thermal pathway between the heat shield 111 and the frame cover 110. Consequently, the plasma 19 directly heats the heat shield 111 but that heat does not permeate towards the frame assembly 17. The weight of the annular frame 16, the frame cover 110, and the heat shield 111 provides a second clamping mechanism of the dicing tape 14 to the electrostatic chuck 15. The second clamping mechanism may also be achieved using an active clamping force. The active clamping force may be achieved through use of a platen mounted—weighted clamp or other clamping device. The active clamping force may be applied directly to the heat shield 111, the frame cover 110, the annular frame 16 or a combination thereof in order to achieve the second clamping mechanism of the dicing tape 14 to the electrostatic chuck 15. The frame assembly 17 is removed from the vacuum processing chamber 113 after the plasma treatment is complete and a cooling stage is initiated as shown in FIG. 2. The frame cover 110 is cooled prior to the commencement of a successive plasma treatment. The cooling effect is achieved by lowering the frame cover 110 so that there is a large contact area between the frame cover 110 and the electrostatic chuck 15. The frame cover 110 is composed of a material with a high thermal conductivity, such as aluminium, and forms a good thermal contact with the electrostatic chuck 15. The good thermal contact between the frame cover 110 and the electrostatic chuck 15 allows the heat from the frame cover 110 to be dissipated easily and allow efficient cooling of the frame cover 110.

Figure 3:
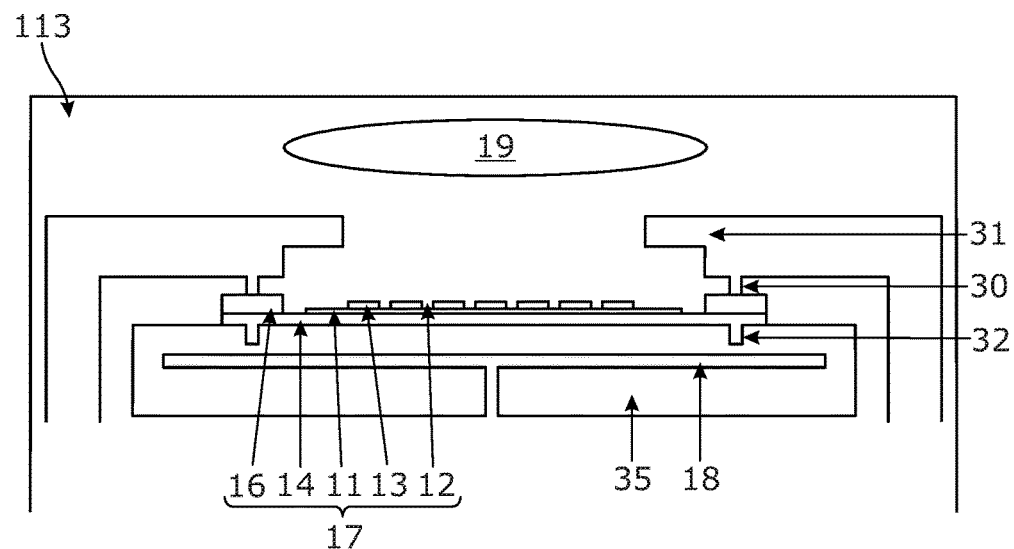
FIG. 3 is a cross sectional view of a semiconductor substrate mounted in a vacuum processing chamber where clamping pins are used to clamp the annular frame to the dicing tape.

In a second embodiment of the invention, the frame assembly 17 is mechanically clamped from above to the electrostatic chuck 35 by the use of clamping pins 30 as shown in FIG. 3. The clamping pins 30 are protrusions from the underside of the frame cover 31 and form a poor thermal contact between the frame cover 31 and the annular frame 16. The frame cover 31 may be provided with additional protection from the plasma 19 in the form of a heat shield 111. If a heat shield 111 is employed, the frame cover 31 is composed of a material with a high thermal conductivity, such as aluminium. However, if a heat shield 111 is not used, the frame cover 31 will be in direct contact with the plasma 19 and a material with a low thermal conductivity, such as alumina or other ceramic material, is preferred.

Figure 4:
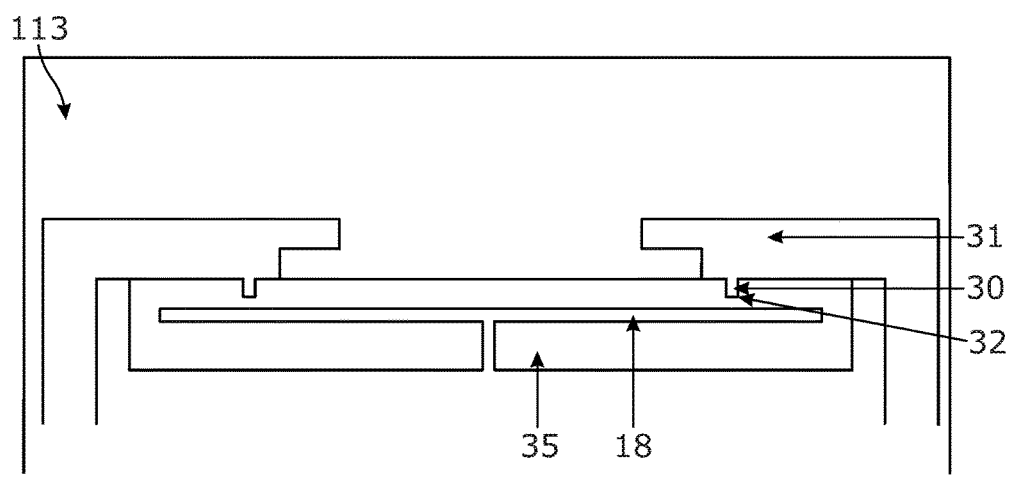
FIG. 4 is a cross sectional view of the vacuum processing chamber (from FIG. 3) during a cooling stage which occurs between successive plasma treatments, where clamping pins are lowered into recesses in the ESC.

The frame assembly 17 is removed from the vacuum processing chamber 113 after the plasma treatment is complete and a cooling stage is initiated as shown in FIG. 4. The frame cover 31 is cooled prior to the commencement of a successive plasma treatment. The cooling effect is achieved by lowering the frame cover 31 so that it is in direct contact with the thermally regulated electrostatic chuck 35. In this embodiment of the invention the clamping pins 30 insert into complementary recesses 32 located in the electrostatic chuck 35. This ensures a high contact area and good thermal contact between the frame cover 31 and the electrostatic chuck 35 to allow efficient cooling of the frame cover 31 during the cooling stage.

Figure 5:
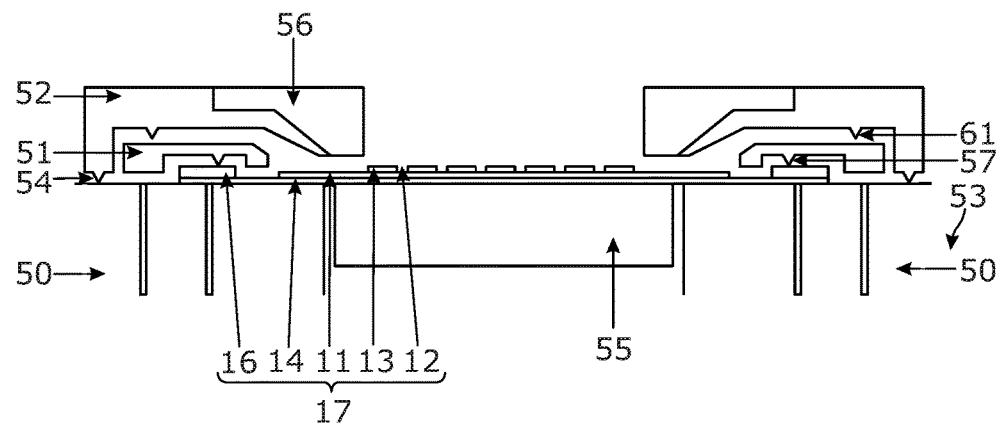
FIG. 5 is a cross sectional view of the heat shield optimised design in its lowered position.

In a third embodiment of the invention, the annular frame 16 is positioned directly on top of a shield ring 50. The shield ring 50 is an annular component surrounding the electrostatic chuck 55. Thermal protection from the plasma 19 is provided by the use of a frame cover 51 and a heat shield 52 as shown in FIG. 5. The shield ring 50 is typically composed of a material with a high thermal conductivity, such as aluminium, and is kept in contact with the walls of the vacuum processing chamber 53. The walls of the vacuum processing chamber 53 are maintained at a suitable temperature, typically about 55° C. The heat shield 52 provides thermal protection for the frame cover 51. The heat shield 52 rests solely on the shield ring 50 and does not contact the frame cover 51 during the plasma treatment. The heat shield 52 is in contact with the shield ring 50 via a series of equidistantly dispersed protrusions such as pips 54. The heat shield 52 may comprise an extension in the form of a tape cover 56 to give protection to the dicing tape 14. The tape cover is typically composed of a material with a poor thermal conductivity, such as alumina or other ceramic material. The heat shield 52 and tape cover 56 are in direct line of sight to the plasma 19 and may reach temperatures in excess of 150° C. The heat shield 52 and tape cover 56 absorb the thermal radiation from the plasma 19 but heat is not readily transferred to the shield ring 50 due to the poor thermal contact of the protrusions 54 to the shield ring 50. This helps to maintain the heat shield 52 and tape cover 56 at a high temperature. The heat shield 52 and tape cover 56 form a thermal shield which results in the frame cover 51 being cooler than in prior art designs. The relatively cool frame cover 51 then also forms a thermal shield around the frame 16. This protects the frame 16 from radiative and convective heat transfer from the heat shield 52 and tape cover 56. Advantageously, the high temperature of the heat shield 52 and tape cover 56 prevents the accumulation of particular deposits, which increases the useable lifetime in between cleaning procedures. The frame cover 51 makes contact with the annular frame 16 via a series of equidistantly dispersed protrusions such as pips 57 which act to mechanically clamp the annular frame 16 to the shield ring 50. The mechanical clamping force may be as a result of the weight of the frame cover 51 or an additional clamping force may be employed. The contact area between the protrusions 57 and the annular frame 16 is minimal which results in a poor thermal contact. The combination of the frame cover 51 being relatively cool, and the poor thermal contact between the protrusions 57 and the frame 16 means that plastic frames can be used without substantial risk of damage. The use of metal frames is possible also.

Figure 6:
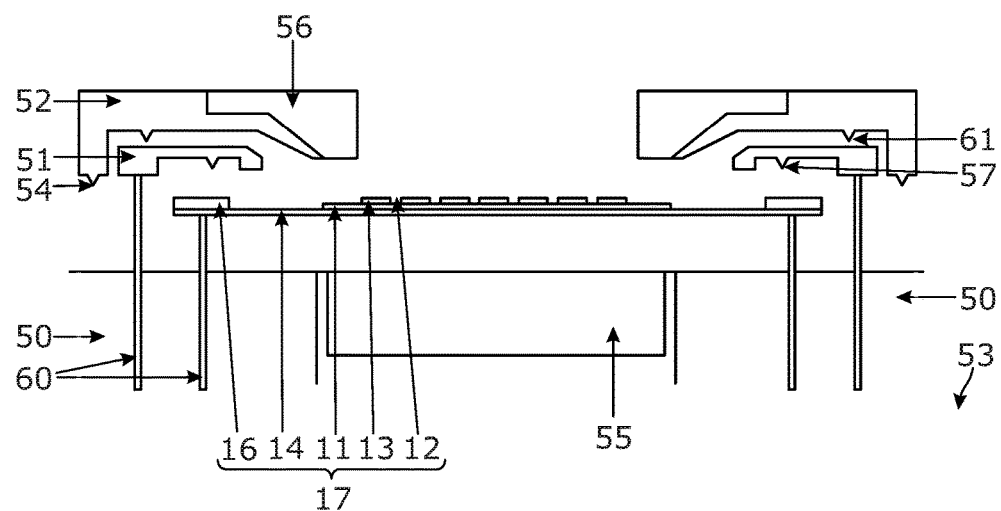
FIG. 6 is a cross sectional view of the heat shield optimised designs in its raised position.
Figure 7:
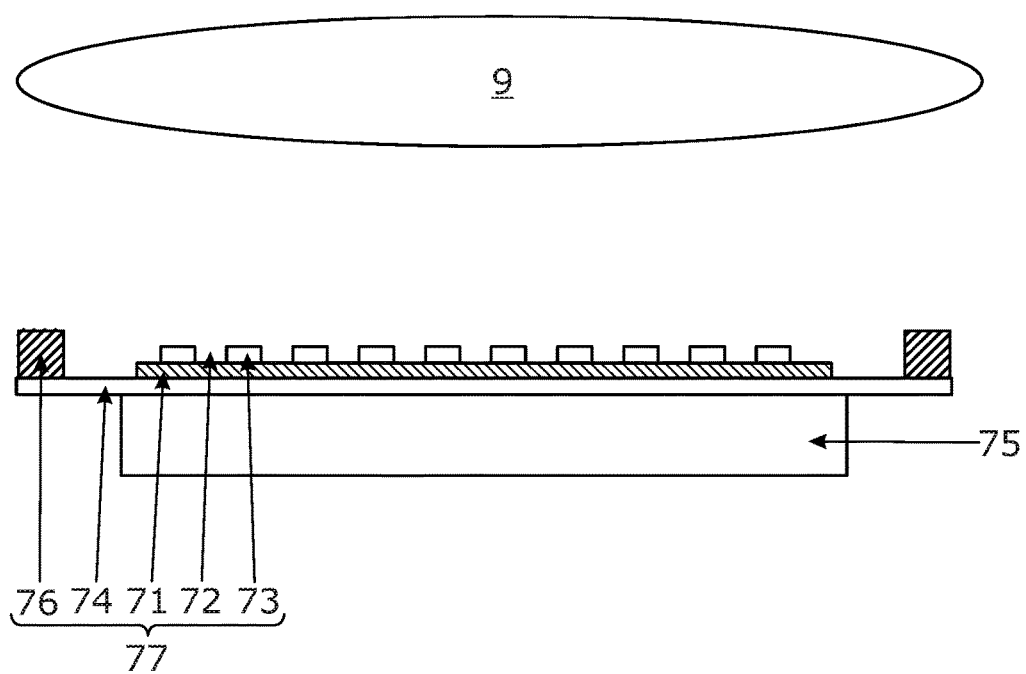
FIG. 7 shows plasma dicing of a workpiece comprising a wafer supported on a tape and frame carrier.

In order to remove the frame assembly 17 from the vacuum processing chamber 113 the annular frame 16 and the frame cover 51 are raised using lifting pins 60. FIG. 6 shows a cross-sectional view of the vacuum processing chamber with lifting pins 60 in the raised position. A poor thermal contact between the heat shield 52 and the frame cover 51 is maintained from the use of equidistantly dispersed protrusions such as pips 61. The minimal contact area of the protrusions 61 minimises heat dissipation from the heat shield 52 to the frame cover 51. Each set of protrusions 54, and 57 has a corresponding recess for them to insert into, which allows the frame cover 51, the heat shield 52 and the shield ring 50 to self-align when the lifting pins are utilised.

What is claimed is:

1. Apparatus for plasma dicing a semiconductor substrate of the type forming part of a workpiece, the workpiece further comprising a carrier sheet on a frame member, wherein the carrier sheet carries the semiconductor substrate, the apparatus comprising:
   a chamber;
   a plasma production device configured to produce a plasma within the chamber suitable for dicing the semiconductor substrate;
   an electrostatic chuck located in the chamber for supporting the workpiece through contact with the carrier sheet; and
   a frame cover element,
   wherein the frame cover element comprises at least one protrusion,
   the electrostatic chuck has at least one recess in a top surface thereof, each said recess being sized to receive therein a respective said protrusion, and
   the frame cover element is supported in the apparatus so as to be movable between a raised position at which each said protrusion is disposed above and spaced from the top surface of the electrostatic chuck and a lowered position at which each said protrusion is received in a respective said recess in the top surface of the electrostatic chuck and the frame cover element contacts the electrostatic chuck, whereby when in use and a workpiece is present on the electrostatic chuck the frame cover element can contact the frame member to clamp the workpiece to the electrostatic chuck and whereby when in use and a workpiece is not present on the electrostatic chuck the frame cover element can contact the electrostatic chuck so that heat transfer can occur between the frame cover element and the electrostatic chuck.

2. An apparatus according to claim 1 further comprising a heat shield disposed over the frame cover element to thermally shield the frame cover element from the plasma.

3. An apparatus according to claim 2 in which the heat shield is spaced apart from the frame cover element.

4. An apparatus according to claim 3 in which the heat shield is supported on the electrostatic chuck.

5. An apparatus according to claim 2 in which the heat shield is in contact with the frame cover element.

6. An apparatus according to claim 2 in which the heat shield is formed from a ceramic material.

7. An apparatus according to claim 1 further comprising at least one clamp which applies a clamping force to the frame cover element to assist the clamping of the carrier sheet against the electrostatic chuck by the frame cover element.

8. An apparatus according to claim 1 in which the frame cover element is formed from metal or a ceramic material.

9. An apparatus according to claim 1 further comprising a lifting mechanism for lowering and raising the frame cover element into and out of contact with the electrostatic chuck when a workpiece is not present on the electrostatic chuck and into and out of contact with the frame member of a workpiece present on the electrostatic chuck.

10. An apparatus according to claim 1 in combination with a workpiece comprising the semiconductor substrate and a carrier sheet on a frame member, wherein the carrier sheet supports the semiconductor substrate, the electrostatic chuck supports the workpiece through contact with the carrier sheet, and the frame member is clamped by the frame cover element.

11. Apparatus according to claim 10 in which the carrier sheet comprises tape formed from a polymeric material, optionally with an adhesive.

12. An apparatus according to claim 1 in which each said at least one protrusion of the frame cover element is a pin, ridge or pip.

13. An apparatus according to claim 1 in which the frame cover element has a surface portion facing toward the electrostatic chuck, and each said protrusion projects toward and is vertically aligned with a respective said recess in the top surface of the electrostatic chuck.

14. An apparatus according to claim 13 in which the surface portion of the frame cover element extends over an outer peripheral portion of the electrostatic chuck along the entire circumference of the electrostatic chuck, and the at least one protrusion comprises a plurality of protrusions spaced from each other in a direction corresponding to the circumferential direction of the electrostatic chuck.

15. An apparatus according to claim 5 in which the heat shield comprises one or more protrusions which contact the frame cover element.

* * * * *